(12) United States Patent
Hautala et al.

(10) Patent No.: US 10,818,499 B2
(45) Date of Patent: Oct. 27, 2020

(54) OPTICAL COMPONENT HAVING VARIABLE DEPTH GRATINGS AND METHOD OF FORMATION

(71) Applicant: Varian Semiconductor Equipment Associates, Inc., Gloucester, MA (US)

(72) Inventors: John Hautala, Beverly, MA (US);
Morgan Evans, Manchester, MA (US);
Rutger Meyer Timmerman Thijssen, Sunnyvale, CA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 159 days.

(21) Appl. No.: 15/901,370

(22) Filed: Feb. 21, 2018

(65) Prior Publication Data

US 2019/0258008 A1    Aug. 22, 2019

(51) Int. Cl.

| | |
|---|---|
| H01L 21/302 | (2006.01) |
| G02B 6/34 | (2006.01) |
| G02B 5/18 | (2006.01) |
| G02B 27/42 | (2006.01) |
| F21V 8/00 | (2006.01) |
| G02B 27/01 | (2006.01) |
| H01L 21/311 | (2006.01) |
| G02B 6/12 | (2006.01) |

(52) U.S. Cl.
CPC .......... *H01L 21/302* (2013.01); *G02B 5/1842* (2013.01); *G02B 5/1857* (2013.01); *G02B 6/0015* (2013.01); *G02B 6/0016* (2013.01); *G02B 6/0018* (2013.01); *G02B 6/34* (2013.01); *G02B 27/0172* (2013.01); *G02B 27/4272* (2013.01); *H01L 21/311* (2013.01); *G02B 2006/12107* (2013.01); *G02B 2027/0109* (2013.01)

(58) Field of Classification Search
None
See application file for complete search history.

(56) References Cited

U.S. PATENT DOCUMENTS

| | | | |
|---|---|---|---|
| 6,545,808 B1 | 4/2003 | Ehbets et al. | |
| 9,513,480 B2 | 12/2016 | Saarikko et al. | |
| 2009/0224416 A1 | 9/2009 | Laakkonen et al. | |
| 2011/0096401 A1 | 4/2011 | Levola | |
| 2016/0033784 A1* | 2/2016 | Levola | G02B 27/4205 385/37 |

FOREIGN PATENT DOCUMENTS

EP    2752691 A1    7/2014

* cited by examiner

*Primary Examiner* — Jiong-Ping Lu (57) ABSTRACT

An optical grating component may include a substrate, and an optical grating, the optical grating being disposed on the substrate. The optical grating may include a plurality of angled structures, disposed at a non-zero angle of inclination with respect to a perpendicular to a plane of the substrate, wherein the plurality of angled structures are arranged to define a variable depth along a first direction, the first direction being parallel to the plane of the substrate.

11 Claims, 10 Drawing Sheets

OPTICAL COMPONENT HAVING VARIABLE DEPTH GRATINGS AND METHOD OF FORMATION

FIELD

This disclosure relates to optical elements, and more particularly to approaches for forming variable gratings in optical lenses.

BACKGROUND

Optical lenses have long been used to manipulate light for various advantages. Recently, micro-diffraction gratings have been utilized in holographic and augmented/virtual reality (AR and VR) devices.

One particular AR and VR device is a wearable display system such as a headset, which is arranged to display an image within a short distance from a human eye. Such wearable headsets are sometimes referred to as head mounted displays, and are provided with a frame displaying an image within a few centimeters of the user's eyes. The image can be a computer generated image on a display, such as a micro display. The optical components are arranged to transport light of the desired image, where the light is generated on the display to the user's eye to make the image visible to the user. The display where the image is generated can form part of a light engine, such that the image itself generates collimated light beams, which beams can be guided by the optical component to provide an image visible to the user.

Different kinds of optical components have been used to convey the image from the display to the human eye. To properly function in an augmented reality lens or combiner, the height (thickness) of an optical grating is designed to vary as a function of distance of propagation of the light across the lens. In known devices, multiple different regions, such as two or more different regions, are formed on the surface of a lens, where the grating height in one region is different from the grating height in other regions. For example, many known devices have three elements: and incoupler, horizontal expander, and outcoupler. To provide these different regions, different etches are used to etch the gratings in different regions so the height of the gratings may differ among the different regions. In addition to increasing processing complexity, the resulting augmented reality lenses provide a blockiness over different portions of a lens, where the height of the gratings increases in a discontinuous fashion between one area and an adjacent area.

Therefore, with respect to at least the above drawbacks the present disclosure is provided.

BRIEF SUMMARY

In one embodiment, an optical grating component is provided. The optical grating component may include a substrate, and an optical grating, the optical grating being disposed on the substrate. The optical grating may include a plurality of angled structures, disposed at a non-zero angle of inclination with respect to a perpendicular to a plane of the substrate, wherein the plurality of angled structures are arranged to define a variable depth along a first direction, the first direction being parallel to the plane of the substrate.

In another embodiment, a method of forming an optical grating component may include providing a substrate, the substrate being optically transparent. The method may include forming a grating layer on the substrate, wherein the grating layer defines a variable height along a first direction. The method may also include forming an optical grating in the grating layer, wherein the optical grating comprises a plurality of angled structures, disposed at a non-zero angle of inclination with respect to a perpendicular to a plane of the substrate. The plurality of angled structures may be arranged to define a variable height along the first direction, the first direction being parallel to the plane of the substrate.

In a further embodiment, a method of forming an optical grating component may include providing a substrate, and forming a grating layer on the substrate, the grating layer comprising a plurality of optical gratings. A first optical grating of the plurality of optical gratings may include a plurality of angled structures, disposed at a non-zero angle of inclination with respect to a perpendicular to a plane of the substrate. The plurality of angled structures may be arranged to define a variable height along a first direction, the first direction being parallel to the plane of the substrate. The method may also include imprinting the plurality of optical gratings into an eyepiece grating layer, the eyepiece grating layer to be arranged on an eyepiece.

In another embodiment, an augmented reality/virtual reality device is provided. The device may include comprising a transparent substrate, and an optical grating, disposed on the transparent substrate. The optical grating may include a plurality of angled structures, disposed at a non-zero angle of inclination with respect to a perpendicular to a plane of the substrate, wherein the plurality of angled structures are arranged to define a variable depth along a first direction, the first direction being parallel to the plane of the substrate.

In another embodiment, a method of forming an optical grating component may include providing a substrate, where the substrate includes an etch stop layer, an optical grating layer, and a mask layer, disposed thereon. The method may also include etching the grating layer using a ribbon ion beam, wherein the substrate is scanned along a scan direction with respect to the ribbon ion beam using a selective area processing recipe. As such, the etching may generate a plurality of angled structures, separated by a plurality of angled trenches, defined by a depth between adjacent angled structures, and wherein the etching generates a variable depth of the angled trenches as a smooth variation in depth be along the scan direction.

In another embodiment, a method of forming an optical grating component may include providing a substrate, the substrate being optically transparent. The method may further include forming a grating layer on the substrate, and patterning the grating layer to from an optical grating, comprising a plurality of lines, extending along a line direction within a plane of the substrate. The method may also include performing a selective area processing operation by scanning the substrate along a scan direction, wherein a variable depth in the optical grating is generated along the scan direction, and wherein the scan direction forms an angle within the plane of the substrate with respect to the line direction of less than ninety degrees and more than zero degrees.

BRIEF DESCRIPTION OF THE DRAWINGS

The accompanying drawings illustrate exemplary approaches of the disclosure, including the practical application of the principles thereof, as follows.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, references to "one embodiment" or "some embodiments" of the present disclosure may be interpreted as including the existence of additional embodiments also incorporating the recited features.

Embodiments herein provide novel optical components and systems and methods for forming an optical component. Various embodiments are related to optical grating components, where the term "optical grating component" refers to a device or part that includes an optical grating, including AR & VR headsets, eyepieces for AR&VR, or masters for forming optical gratings for eyepieces such as eyeglasses.

Figure 1A:
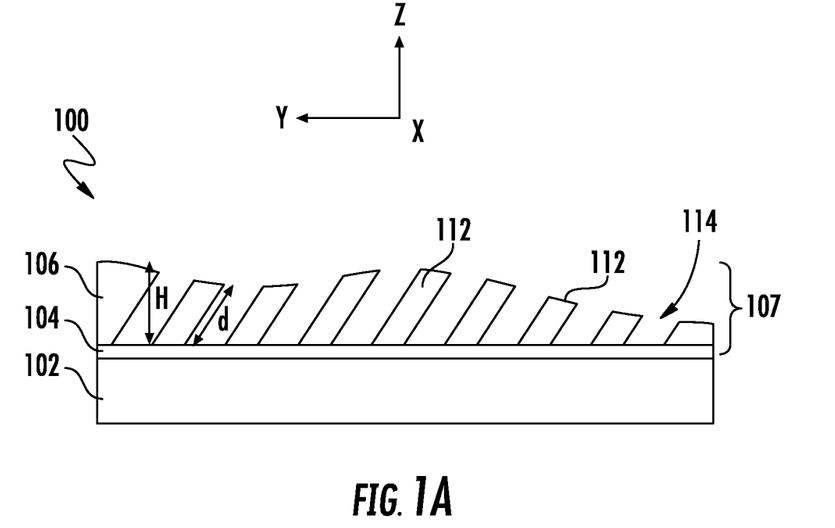
FIG. 1A depicts a side cross sectional view of an optical grating component, according to embodiments of the disclosure.
Figure 1B:
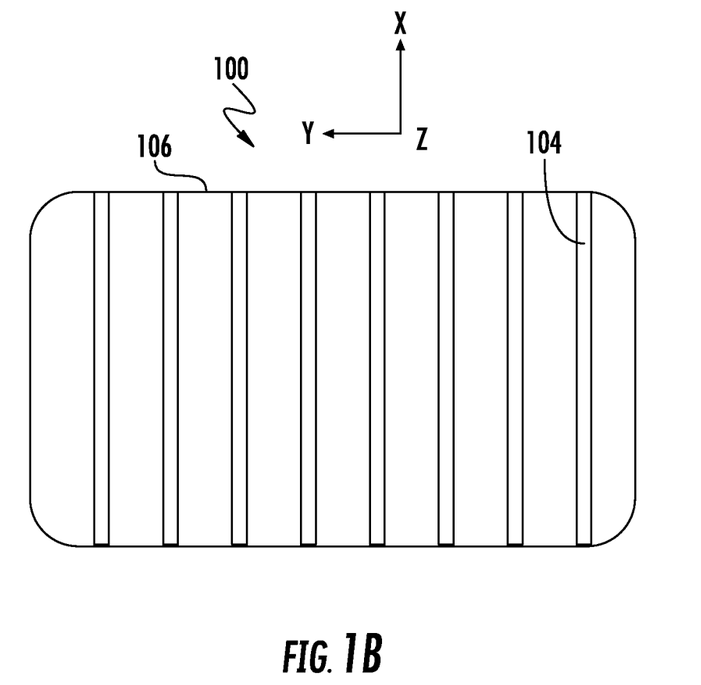
FIG. 1B depicts a top plan view of the optical grating component of FIG. 1A.

FIG. 1A depicts a side cross sectional view of an optical grating component 100, according to embodiments of the disclosure. FIG. 1B depicts a top plan view of the optical grating component 100. The optical grating component 100 may be used as an optical grating to be placed on an eyeglass or formed integrally in the eyeglass in accordance with various embodiments of the disclosure. The optical grating component 100 includes a substrate 102, and optical grating 106, disposed on the substrate 102. In some embodiments, the substrate 102 is an optically transparent material, such as a known glass. The embodiments are not limited in this context. The optical grating 106 may be disposed in an optical grating layer 107, as described further below. In the embodiment of FIG. 1A and FIG. 1B, the optical grating component 100 further includes etch stop layer 104, disposed between the substrate 102 and optical grating layer 107. According to some embodiments of the disclosure, the optical grating layer 107 may be an optically transparent material, such as silicon oxide, silicon nitride, glass, $TiO_2$, or other material.

According to some embodiments of the disclosure, the optical grating 106 may comprise a grating height H in the range of 100 nm to 1000 nm. As, such the optical grating 106 may be appropriate for use in an eyepiece of a AR &VR apparatus. The embodiments are not limited in this context. In accordance with some embodiments, the etch stop layer 104 may be an optically transparent material and may have a thickness of 10 nm to 100 nm. The embodiments are not limited in this context. Examples of a suitable material for etch stop layer 104 include SiN, $SiO_2$, TiN, SiC, and other materials. In embodiments where the optical grating 106 is to be applied to or incorporated in an eyepiece of an eyeglass, an especially appropriate material is an optically transparent material. In embodiments where the optical grating component 100 forms a master for fabricating optical gratings for an eyepiece, the etch stop layer 104 need not be optically transparent. Moreover, the etch stop layer 104 may be omitted in some embodiments.

As further shown in FIG. 1A, the optical grating 106 may comprise a plurality of angled structures, shown as angled structures 112, disposed at a non-zero angle of inclination (θ), with respect to a perpendicular to a plane of the substrate 102, wherein the angled structures 112 are arranged to define a variable height along a first direction. In the example of FIG. 1A, the angled structures 112 define a variable height along the direction parallel to the Y-axis of the Cartesian coordinate system shown, where the first direction (Y-Axis) is parallel to the plane of the substrate 102, in this case the X-Y plane. A hallmark of the optical grating 106 is a smooth variation in grating height H along the first direction, that is, along the "Y-direction." The optical grating 106 is also characterized by a smooth variation in depth d, between angled structures 112. In various embodiments, the variation in grating height H may be on the order of 10%, 20%, 30%, or 100% across the width direction (Y-direction) from left to right in FIG. 1A. Notably, the width of the optical grating 106 along the Y-direction may be on the order of several millimeters to several centimeters, while the grating height H may be on the order of 1 micrometer or less. Accordingly, the variation in grating height H may range on the order of several hundred nanometers or less. An example of a smooth variation in grating height H or depth d is where a change in grating height H or depth d between adjacent lines of a grating is less than 10%, less than 5%, or less than 1%. The embodiments are not limited in this context. Thus, in an eyepiece, the grating height H may vary continuously and in a non-abrupt fashion in a given direction along the surface of the eyepiece over a distance of, for example, millimeters to centimeters. More particularly, a change in grating height H of 50% over a 5 mm distance may entail changing the grating height H continuously over approximately $5 \times 10^3$ lines having a pitch of one micrometer. This change entails an average change in relative height of adjacent lines of $0.5/5 \times 10^4$ or approximately 0.01%.

One effect of the smooth variation in grating height H or depth d is to improve performance of an augmented reality glasses by improving the guiding of light from a light source across the surface of an eyepiece, where the smooth variation in grating height H generates a better distribution of light, and better augmented reality image.

Turning again to FIG. 1B, there is shown a 2-dimensional representation of the optical grating 106 in top plan view, where the optical grating 106 may have an area on the order of a few square centimeters. As illustrated, the angled structures 112 may extend along a second direction (X-direction), such as perpendicular to the Y-direction. According to some embodiments, the grating height H may be uniform along the X-direction, meaning that the grating height H may vary smoothly along the Y-direction, while grating height H is constant along the X direction, for a given one of the angled structures 112. In this respect, the pitch of the angled structures 112 in the optical grating 106 may be on the order of the wavelength of visible light, meaning that the optical grating 106 may include tens of thousands of angled structures 112. Thus, the variation in height along the Y-direction within a single one of the angled structures 112 may be negligible.

Figure 2A:
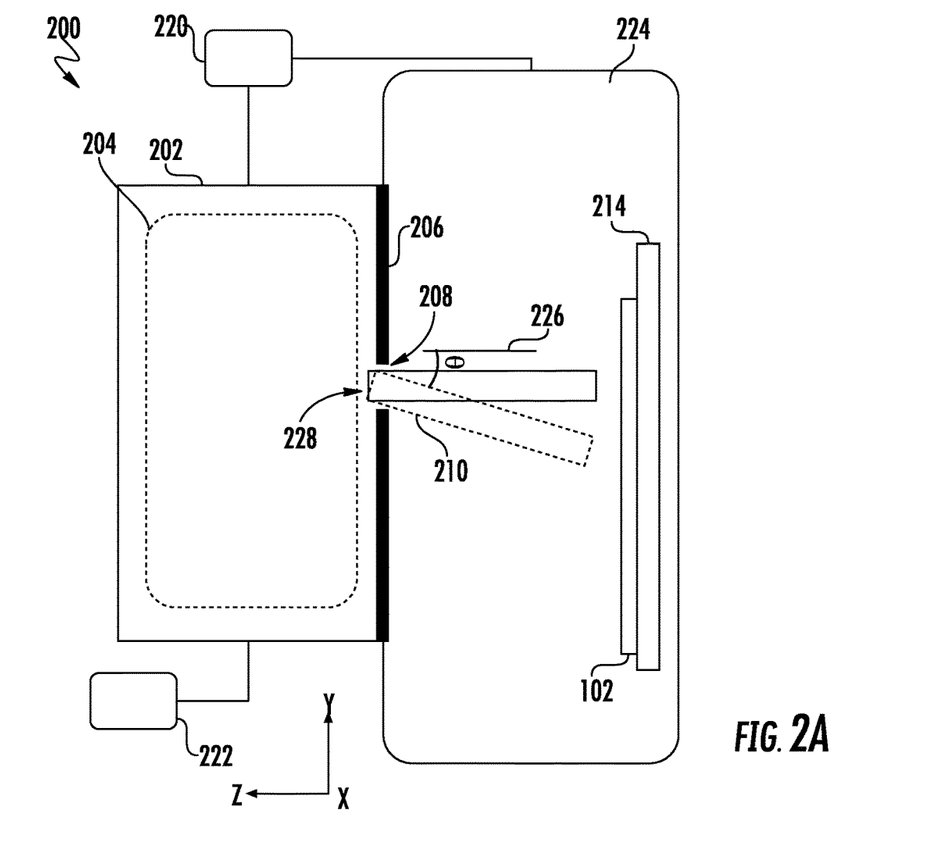
FIG. 2A shows a processing apparatus, depicted in schematic form, in accordance with embodiments of the present disclosure.

Turning now to FIG. 2A, there is shown a processing apparatus 200, depicted in schematic form. The processing apparatus 200 represents a processing apparatus for etching portions of a substrate, or depositing on a substrate, to generate, for example, the optical gratings of the present embodiments. The processing apparatus 200 may be a plasma based processing system having a plasma chamber 202 for generating a plasma 204 therein by any convenient method as known in the art. An extraction plate 206 may be provided as shown, having an extraction aperture 208, where a non-uniform etching or non-uniform deposition may be performed to reactively etch or deposit an optical grating layer 107. A substrate 102, including, for example, the aforementioned optical grating structure, is disposed in the process chamber 224. A substrate plane of the substrate 102 is represented by the X-Y plane of the Cartesian coordinate system shown, while a perpendicular to the plane of the substrate 102 lies along the Z-axis (Z-direction).

As further shown in FIG. 2A, an ion beam 210 may be extracted when a voltage difference is applied using bias supply 220 between the plasma chamber 202 and substrate 102, or substrate platen 214, as in known systems. The bias supply 220 may be coupled to the process chamber 224, for example, where the process chamber 224 and substrate 102 are held at the same potential.

According to various embodiments, the ion beam 210 may be extracted along the perpendicular 226 or may be extracted at a non-zero angle of incidence, shown as θ, with respect to the perpendicular 226.

The trajectories of ions within the ion beam 210 may be mutually parallel to one another or may lie within a narrow angular range, such as within 10 degrees of one another or less. Thus, the value of B may represent an average value of incidence angle where the individually trajectories vary up to several degrees from the average value. In various embodiments, the ion beam 210 may be extracted as a continuous beam or as a pulsed ion beam as in known systems. For example, the bias supply 220 may be configured to supply a voltage difference between plasma chamber 202 and process chamber 224, as a pulsed DC voltage, where the voltage, pulse frequency, and duty cycle of the pulsed voltage may be independently adjusted from one another.

In various embodiments, gas, such as reactive gas, may be supplied by the source 222 to plasma chamber 202. The plasma 204 may generate various etching species or depositing species, depending upon the exact composition of species provided to the plasma chamber 202.

Figure 2B:
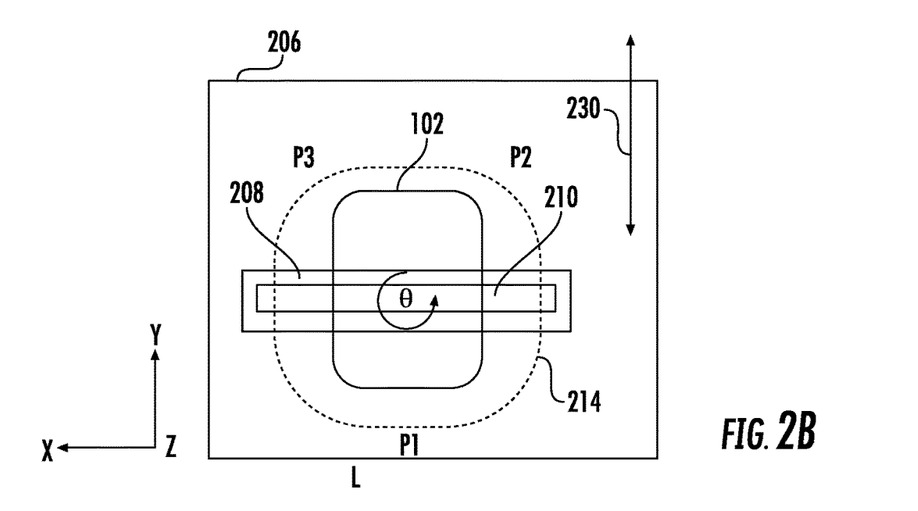
FIG. 2B. shows an extraction plate component and substrate in top plan view in accordance with embodiments of the present disclosure.

In various embodiments, the ion beam 210 may be provided as a ribbon ion beam having a long axis extending along the X-direction of the Cartesian coordinate system shown in FIG. 2B. By scanning a substrate platen 214 including substrate 102 with respect to the extraction aperture 208, and thus with respect to the ion beam 210 along the scan direction 230, the ion beam 210 may etch the substrate 102 or deposit upon the substrate 102. The ion beam 210 may be composed of any convenient gas mixture, including inert gas, reactive gas, and may be provided in conjunction with other gaseous species in some embodiments. In particular embodiments, the ion beam 210 and other reactive species may be provided as an etch recipe to the substrate 102 so as to perform a directed reactive ion etching of a layer, such as the optical grating layer 107. Such an etch recipe may use known reactive ion etch chemistries for etching materials such as oxide or other material, as known in the art. In other embodiments, the ion beam 210 may be formed of inert species where the ion beam 210 is provided to etch the substrate 102 or more particularly, the optical grating layer 107, by physical sputtering, as the substrate 102 is scanned with respect to ion beam 210.

In this example of FIG. 2B, the ion beam 210 is provided as a ribbon ion beam extending to a beam width along the X-direction, where the beam width is adequate to expose an entire width of the substrate 102, even at the widest part along the X-direction. Exemplary beam widths may be in the range of 10 cm, 20 cm, 30 cm, or more while exemplary beam lengths along the Y-direction may be in the range of 2 mm, 3 mm, 5 mm, 10 mm, or 20 mm. The embodiments are not limited in this context.

Notably, the scan direction 230 may represent the scanning of substrate 102 in two opposing (180 degrees) directions along the Y-direction, or just a scan toward the left or a scan toward the right. As shown in FIG. 2B, the long axis of ion beam 210 extends along the X-direction, perpendicularly to the scan direction 230. Accordingly, an entirety of the substrate 102 may be exposed to the ion beam 210 when scanning of the substrate 102 takes place along a scan direction 230 to an adequate length from a left side to right side of substrate 102, as shown in FIG. 2B.

In various embodiments, as detailed below, the processing apparatus 200 may be used to form a non-uniform grating layer, having a variable grating height, as shown above with respect to FIG. 1A. This variable grating height may be accomplished by scanning the substrate 102 with respect to the ion beam 210 using a selected area processing (SAP) recipe. In brief, a SAP scan recipe may entail varying at least one process parameter of a set of process parameters, having the effect of changing the etch rate or deposition rate caused by the ion beam 210 during scanning of the substrate 102. Such process parameters may include the scan rate of the substrate 102, the ion energy of the ion beam 210, duty cycle of the ion beam 210 when provided as a pulsed ion beam, and rotational position of the substrate 102. The embodiments are not limited in this context. Because the deposition rate or etch rate caused by the ion beam 210 varies during scanning of the substrate 102, the thickness or height of the optical grating layer 107 may vary along the scan direction (Y-axis), generating (after further process operations, detailed below) the resultant structure as shown in FIG. 1A.

Figure 3A:
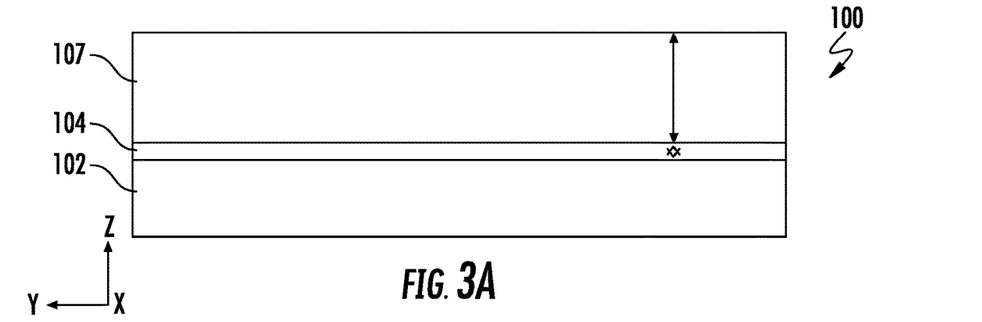
FIG. 3A-FIG. 3D depict various stages in fabrication of an optical grating component according to some embodiments of the disclosure.
Figure 3B:
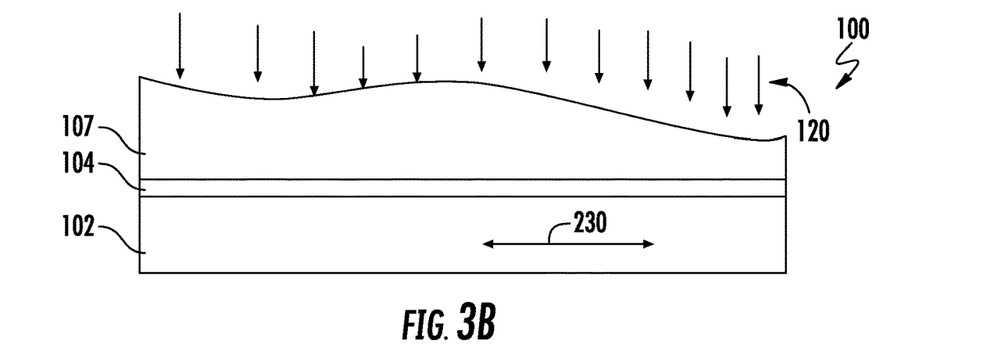

Turning now to FIG. 3A there is shown a side cross-sectional view of the optical grating component 100 at one instance of fabrication. In the instance shown, an optical grating layer 107 having uniform height is disposed on the etch stop layer 104, which layer is disposed directly upon the substrate 102. In FIG. 3B, there is shown a subsequent instance where the substrate 102 is subjected to selective area processing using etching ions 120. The etching ions 120 may be provided as a ribbon beam as discussed above, where the ribbon beam is elongated along the X-axis, while the substrate 102 is scanned along the Y-axis, equivalent to the scan direction 230. According to the present embodiments, the degree of etching of the optical grating layer 107 caused by etching ions 120 may be varied along the scan direction 230 by varying any combination of the aforementioned parameters. For example, the scan rate of the substrate platen 214 may be varied as the substrate 102 is scanned under an ion beam containing the etching ions 120. In some embodiments where the width of an ion beam along the Y-axis is 1 mm to 3 mm, for example, the width of the optical grating 106 along the Y-axis may be 2 cm. Accordingly, a non-uniform etch profile may be introduced into the optical grating layer 107 by adjusting the scan rate of the narrow (1 mm wide) ion beam during scanning across the 2-cm width of the optical grating 106.

In another embodiment, the etching ions 120 may be provided in a pulsed ion beam, where the duty cycle of the pulsed ion beam is varied while the substrate 102 is scanned along the Y-axis. Notably, known pulsed supplies may pulse ion beams at frequencies in the kHZ range, meaning that the duty cycle can be adjusted over periods of milliseconds or less. Accordingly, for a scan rate of the substrate 102 on the order of millimeters per second, the duty cycle may be adjusted many thousands of times during scanning across a 2-cm optical grating, for example. Thus, the effective etch rate of the etching ions 120 may be finely tailored along the Y-axis.

According to some embodiments of the disclosure, a designed or theoretical grating height profile for a given optical grating may be calculated to optimize performance of the optical grating. This grating height profile may then be used to program and SAP recipe for the processing apparatus 200 to generate the grating height profile in the optical grating layer 107 using etching ions 120.

Figure 3C:
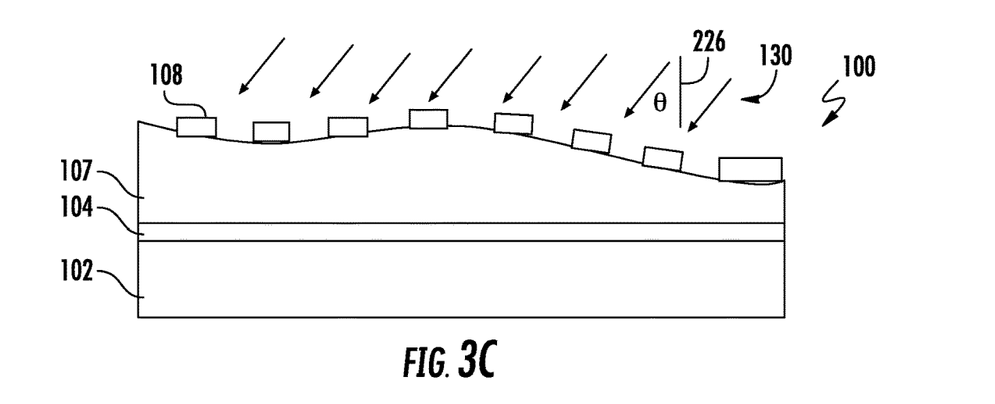

In FIG. 3C, a further instance of processing the optical grating component 100 is shown. At this instance, a mask layer 108, such as a hard mask, has been formed on the optical grating layer 107. The mask layer 108 may be formed of material such as carbon, $SiO_2$, SiC, $AlO_x$, $ZrO_x$, and so forth. In accordance with various embodiments, a directional reactive ion etching process is performed to etch the optical grating layer 107. The directional reactive ion etch is represented by etching ions 130. The etch chemistry may include the etching ions 130 as well as other non-ionic species, and may be chosen according to known reactive ion etch compositions for selectively etching the optical grating layer. For example, the etch chemistry may be chosen to selectively etch $SiO_2$ with respect to carbon in one example. Returning to FIG. 2A and FIG. 2B, the etching ions 130 may be provided as a ribbon ion beam, with the ion trajectories of the ribbon ion beam defining a non-zero angle of inclination B with respect to the perpendicular 226, as shown. The non-zero angle of incidence may be generated according to known techniques, such as using a beam blocker adjacent the extraction aperture 208, adjusting the extraction aperture width along the Y-axis, as well adjusting plasma conditions within the plasma 204, including gas pressure, to change the curvature of the plasma sheath boundary 228, proximate the extraction aperture 208.

Figure 3D:
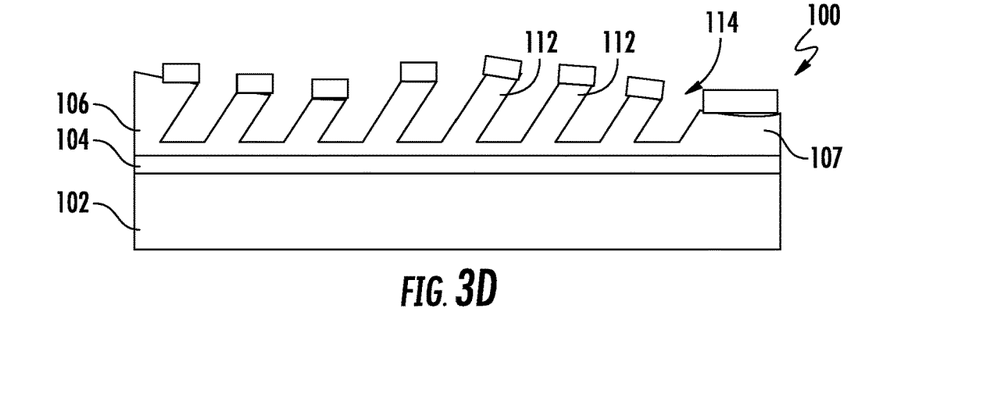

Turning now to FIG. 3D there is shown a later instance after partial etching of the optical grating layer 107 to form the angled structures 112. The non-zero angle of inclination may match that of the etching ions 130. The etching may proceed until the stage as shown in FIG. 1A, where a plurality of trenches, shown as trenches 114 are etched so as to expose the etch stop layer 104. According to various embodiments, the etch chemistry for the etching ions 130 is arranged so that the optical grating layer 107 is also selectively etched with respect to the etch stop layer 104. Once the etch stop layer 104 is encountered etching slows and the process of etching ions 130 may be conveniently terminated.

According to various embodiments, the mask layer 108 is arranged as a plurality of mask elements having the shape of stripes, elongated along the X-axis to generate the angled structures 112, also elongated along the X-axis as shown in FIG. 1B. Additionally, while the etching ions 130 may form part of an ion beam extending 1 mm or 2 mm in width along the Y-axis, the substrate 102 may be scanned along the Y-axis to expose the entirety of an optical grating structure of several centimeter width to the etching ions 130. Accordingly, in some embodiments, the etching operations of FIG. 3B and FIG. 3C may be performed in a common apparatus, such as the process apparatus 200.

Turning now to FIG. 3A there is shown a side cross-sectional view of the optical grating component 100 at one instance of fabrication. In the instance shown, an optical grating layer 107 having uniform height is disposed on the etch stop layer 104, which layer is disposed directly upon the substrate 102. In FIG. 3B, there is shown a subsequent instance where the substrate 102 is subjected to selective area processing using etching ions 120. The etching ions 120 may be provided as a ribbon beam as discussed above, where the ribbon beam is elongated along the X-axis, while the substrate 102 is scanned along the Y-axis, equivalent to the scan direction 230. According to the present embodiments, the degree of etching of the optical grating layer 107 caused by etching ions 120 may be varied along the scan direction 230 by varying any combination of the aforementioned parameters. For example, the scan rate of the substrate platen 214 may be varied as the substrate 102 is scanned under an ion beam containing the etching ions 120. In some embodiments where the width of an ion beam along the Y-axis is 1 mm to 3 mm, for example, the width of the optical grating 106 along the Y-axis may be 2 cm. Accordingly, a non-uniform etch profile may be introduced into the optical grating layer 107 by adjusting the scan rate of the narrow (1 mm wide) ion beam during scanning across the 2-cm width of the optical grating 106.

In another embodiment, the etching ions 120 may be provided in a pulsed ion beam, where the duty cycle of the pulsed ion beam is varied while the substrate 102 is scanned along the Y-axis. Notably, known pulsed supplies may pulse ion beams at frequencies in the kHZ range, meaning that the duty cycle can be adjusted over periods of milliseconds or less. Accordingly, for a scan rate of the substrate 102 on the order of millimeters per second, the duty cycle may be adjusted many thousands of times during scanning across a 2-cm optical grating, for example. Thus, the effective etch rate of the etching ions 120 may be finely tailored along the Y-axis.

According to some embodiments of the disclosure, a designed or theoretical grating height profile for a given optical grating may be calculated to optimize performance of the optical grating. This grating height profile may then be used to program and SAP recipe for the processing apparatus 200 to generate the grating height profile in the optical grating layer 107 using etching ions 120.

Figure 4A:
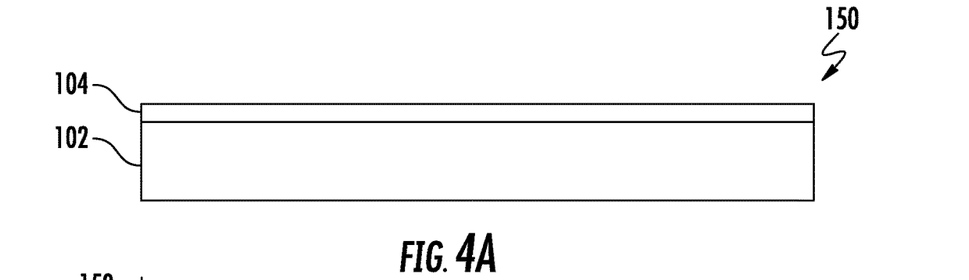
FIG. 4A-FIG. 4D depict various stages in fabrication of another optical grating component according to some embodiments of the disclosure.
Figure 4B:
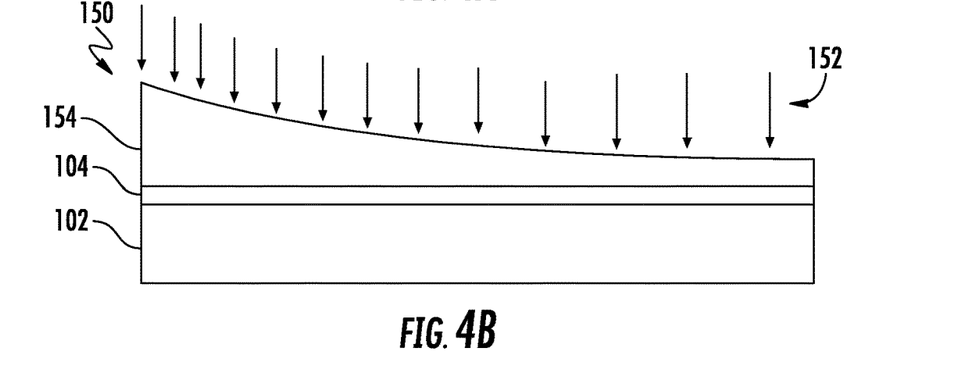

Turning now to FIGS. 4A-4D there is shown another sequence of operations for forming an optical grating component 150, according to alternative embodiments of the disclosure. In FIG. 4A, there is shown the substrate 102, etch stop layer 104 in place. In FIG. 4B, there is shown a subsequent operation where the substrate 102 and etch stop layer 104 are subjected to selective area processing using depositing ions 152. The depositing ions 152 may be provided as a ribbon beam as discussed above, where the ribbon beam is elongated along the X-axis, while the substrate 102 is scanned along the Y-axis, equivalent to the scan direction 230. According to the present embodiments, the thickness of the deposition of the optical grating layer 154 caused by depositing ions 152 may be varied along the scan direction 230 by varying any combination of the aforementioned parameters. For example, the scan rate of the substrate platen 214 may be varied as the substrate 102 is scanned under an ion beam containing the depositing ions 152. In some embodiments where the width of an ion beam along the Y-axis is 1 mm to 3 mm, for example, the width of the optical grating 156 to be formed along the Y-axis may be 2 cm. Accordingly, a non-uniform thickness (height) profile may be introduced into the optical grating layer 154 by adjusting the scan rate of the narrow (1 mm wide) ion beam during scanning across the 2-cm width of the optical grating 156.

In another embodiment, the depositing ions 152 may be provided in a pulsed ion beam, where the duty cycle of the pulsed ion beam is varied while the substrate 102 is scanned along the Y-axis. example. Thus, the effective deposition rate of the depositing ions 152 may be finely tailored along the Y-axis to generate a designed grating height profile.

Figure 4C:
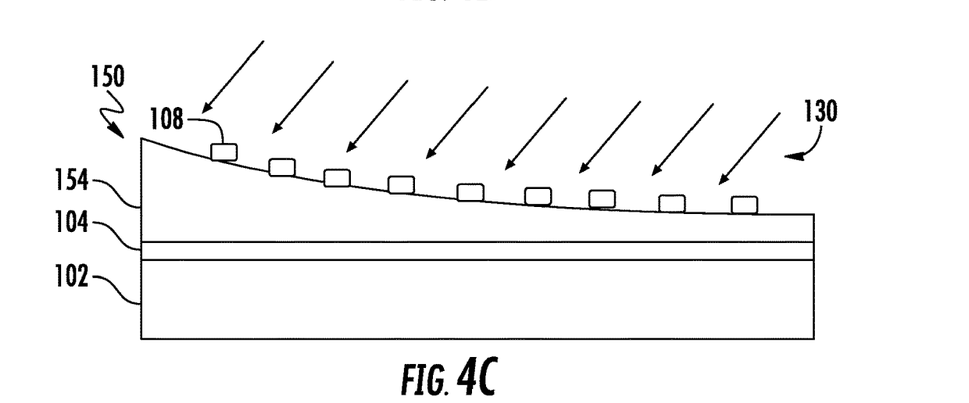
Figure 4D:
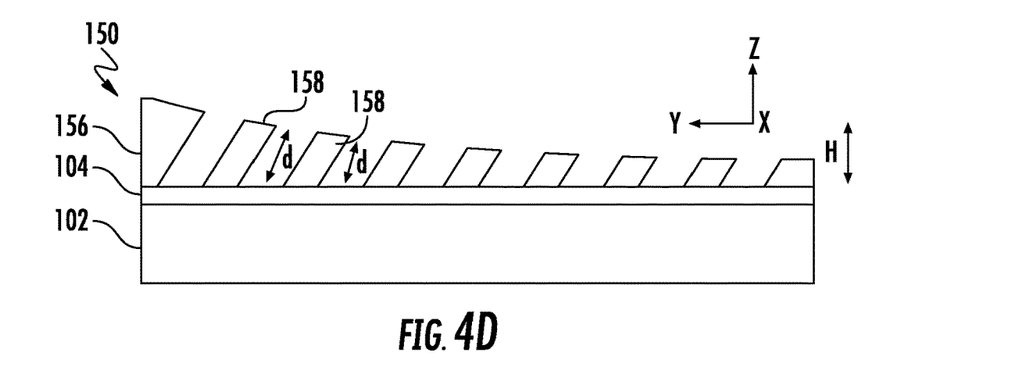

In FIG. 4C, a mask layer 108 is formed on the optical grating layer 154. Subsequently, etching ions 130 may be directed to the substrate 102 at a non-zero angle of incidence, as detailed above. FIG. 4D shows the resulting structure, optical grating 156, including angled structures 158, after etching of the optical grating layer is complete and the mask layer 108 is removed.

In accordance with additional embodiments of the disclosure, fabrication of a plurality of optical gratings may be readily accomplished by performing variants of the selective area processing of an optical grating layer discussed above. In some embodiments, a plurality of optical grating regions may be prepatterned on one substrate or multiple substrates, where the substrate or substrates are placed on the substrate platen 214. In particular embodiments, a substrate having a plurality of different optical gratings may be fabricated where the direction of the angled features varies between gratings. By way of background, known AR eyepieces may be formed when multiple different optical gratings are arranged on a transparent eyepiece. A first optical grating may have angled structures oriented from top to bottom of the eyepiece, while a second optical grating may have angled structures oriented from left to right on the eyepiece.

Figure 5A:
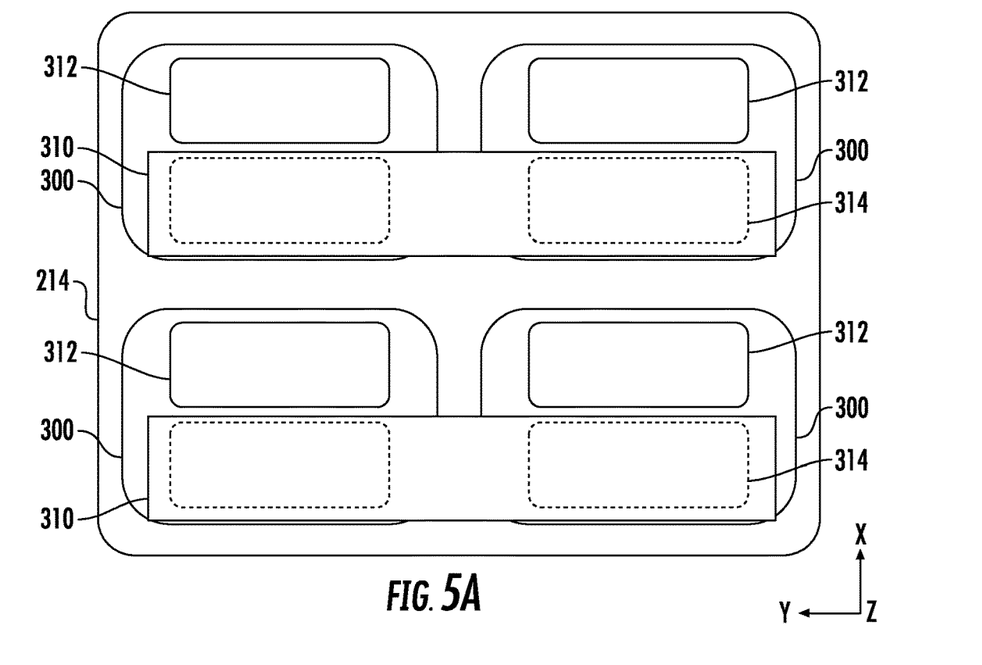
FIG. 5A and FIG. 5B show the geometry for generating multiple different optical gratings, in accordance with some embodiments of the disclosure.
Figure 5B:
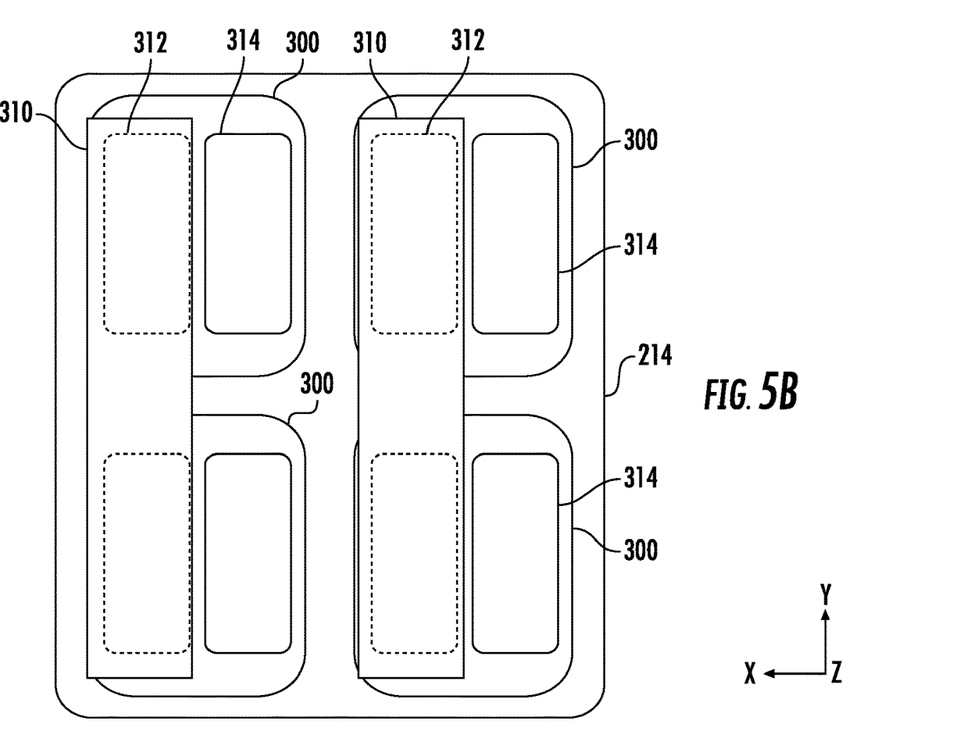

Turning to FIG. 5A and FIG. 5B there is shown the geometry for generating multiple different optical gratings in a given eyepiece, in accordance with some embodiments of the disclosure. As shown top plan view, a plurality of substrates, shown as substrates 300, are disposed on the substrate platen 214. Referring also to FIG. 2B, the substrate platen 214 may be coupled to a stage (not shown), provided with rotation through a twist angle φ, about the Z-axis, meaning the perpendicular to the plane of the substrates 300. In FIG. 5A the substrate platen is oriented at a first twist angle, while in FIG. 5B, the substrate platen is oriented at a second twist angle, rotated 90 degrees from the first twist angle. As further shown, a given substrate includes an optical grating layer 312 and optical grating layer 314. In the view of FIG. 5A, the optical grating layer 312 may have a variable grating height and variable depth (Z-direction), where the variation in grating height is along the Y-axis, while the optical grating layer 314 has a variable grating height and variable depth along the X-axis. As shown in FIG. 5A, four different substrates, substrates 300, are arranged on the substrate platen 214. The optical grating layers 314 are masked on the substrates 300 using mask 310, where the mask 310 may be a proximity mask, photoresist, or other mask.

Figure 5C:
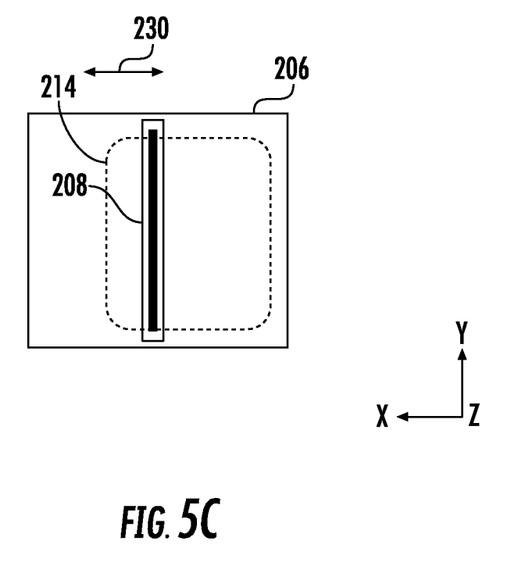
FIG. 5C shows the scanning geometry for generating the optical gratings of FIG. 5A and FIG. 5B.
Figure 5D:
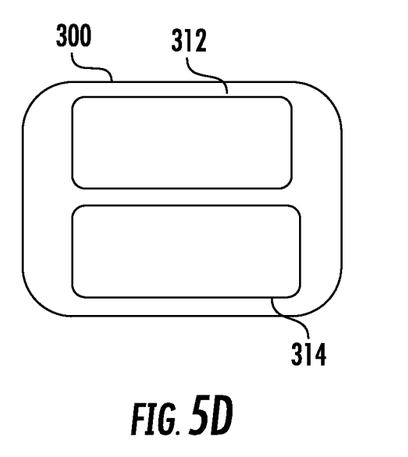
FIG. 5D shows an unmasked grating of FIG. 5A and FIG. 5B.

In operation, as shown in FIG. 5C, the substrate platen 214 is scanned along the scan direction 230, parallel to the Y-axis. The optical grating layers 312 are exposed, so a ribbon ion beam extracted through the extraction aperture 208 impinges on the optical grating layers 312. As the substrates 300 are scanned along the scan direction 230, an SAP recipe is applied to the processing apparatus 200 to generate a variable height of the optical grating layer 312 along the Y-axis, as described above with respect to FIG. 3B or FIG. 4B, for example. Subsequently, the optical grating layers 312 may be masked, while the optical grating layers 314 are unmasked. The substrate platen 214 may then be rotated through ninety degrees to the orientation shown in FIG. 5B. The substrate platen 214 may then be scanned along the scan direction 230 using an SAP recipe in the processing apparatus 200 to generate a variable height of the optical grating layer 314 along the Y-axis. Notably, the variable height profile of the optical grating layer 314 may be different than the variable height profile of the optical grating layer 312. Because the substrate platen 214 is rotated by 90 degrees during the scan associated with FIG. 5B with respect to the scan associated with FIG. 5A, the variation in height in the optical grating layer 314 takes place along a direction that is perpendicular to the direction of the height variation for optical grating layer 312. In this manner, the substrates 300, shown unmasked in FIG. 5D, may be used to directly form eyepieces having mutually orthogonally oriented optical gratings, suitable for AR devices, for example. In other embodiments, different optical gratings may be mutually oriented at different angles. In one example, three different gratings may be provided with a mutual orientation of 0 degrees, 45 degrees, and 90 degrees with respect to one another. In a particular embodiment, the grating oriented at zero degrees may have uniform height, while the gratings oriented at 45 degrees and 90 degrees have variable height. The embodiments are not limited in this context.

Figure 6A:
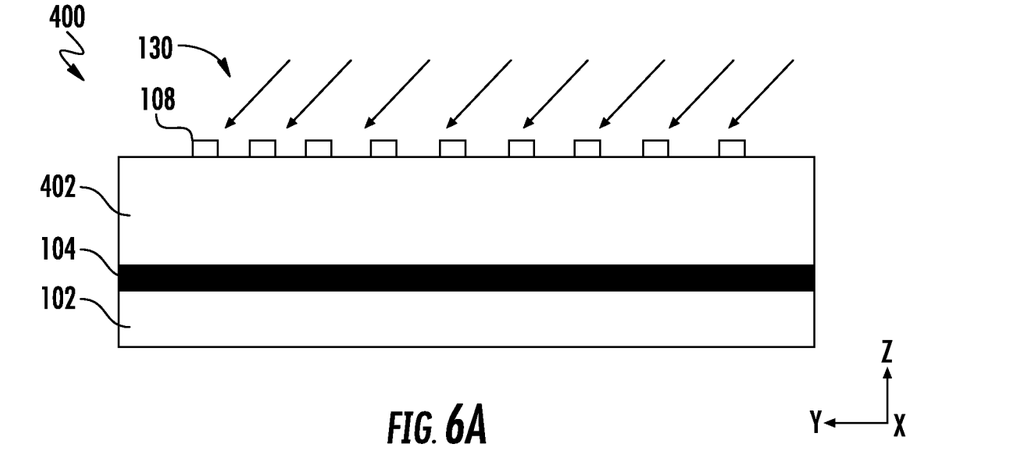
FIG. 6A-FIG. 6C depict various stages in fabrication of an optical grating component according to some embodiments of the disclosure.
Figure 6B:
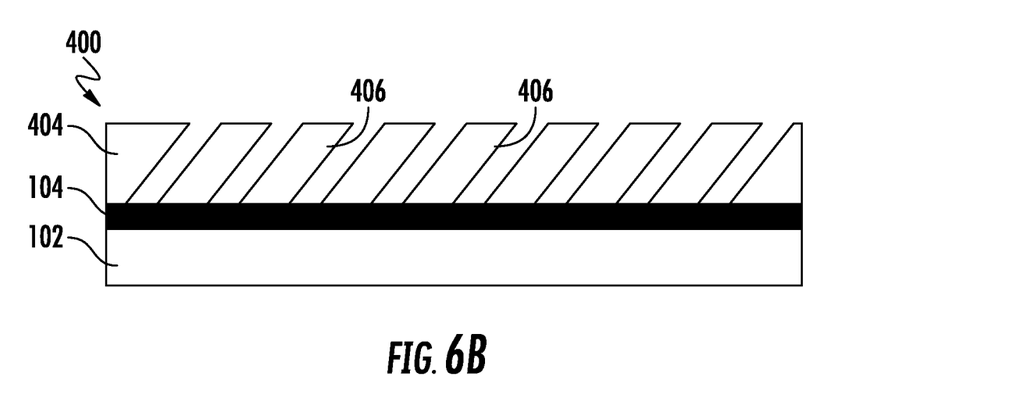

Turning now to FIGS. 6A-6C there is shown another sequence of operations for forming an optical grating component 400, according to alternative embodiments of the disclosure. In FIG. 6A, there is shown the substrate 102, etch stop layer 104, an optical grating layer 402, and mask layer 108 in place, as generally described above. In FIG. 6A, there is shown the operation where a directional reactive ion etching process is performed to etch the optical grating layer 402. The directional reactive ion etch is represented by etching ions 130, and may proceed generally as described above. Different from the previous embodiments, the optical grating layer 402 has a uniform height along the Z-axis. At FIG. 6B, a subsequent instance is shown where etching of the optical grating layer 402 is complete. At this stage, the optical grating layer 402 has been etched to the etch stop layer 104, to form the optical grating 404, having angled structures 406. Notably, the height of the optical grating layer 402 is uniform.

Figure 6C:
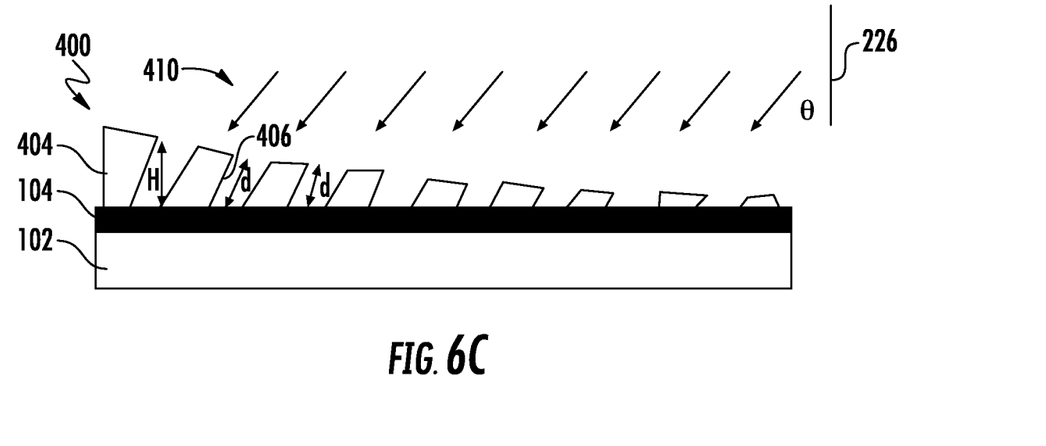

Turning to FIG. 6C there is shown a subsequent operation where the substrate 102 is subjected to selective area processing using etching ions 410. The etching ions 410 may be provided as a ribbon beam as discussed above, where the intensity of the etching varies along Y-axis, as suggested by the arrows. In this manner, the height of the structures of the optical grating 404 varies, resulting in a variable height for the optical grating along the Y-axis. In particular embodiments, as suggested by FIG. 6C, the etching ions 410 may be directed at a non-zero angle of incidence with respect to the perpendicular 226. For example, the trajectories of etching ions 410 may match the trajectory of etching ions 130, wherein the sidewalls of the angled structures 406 are not impacted.

Figure 7A:
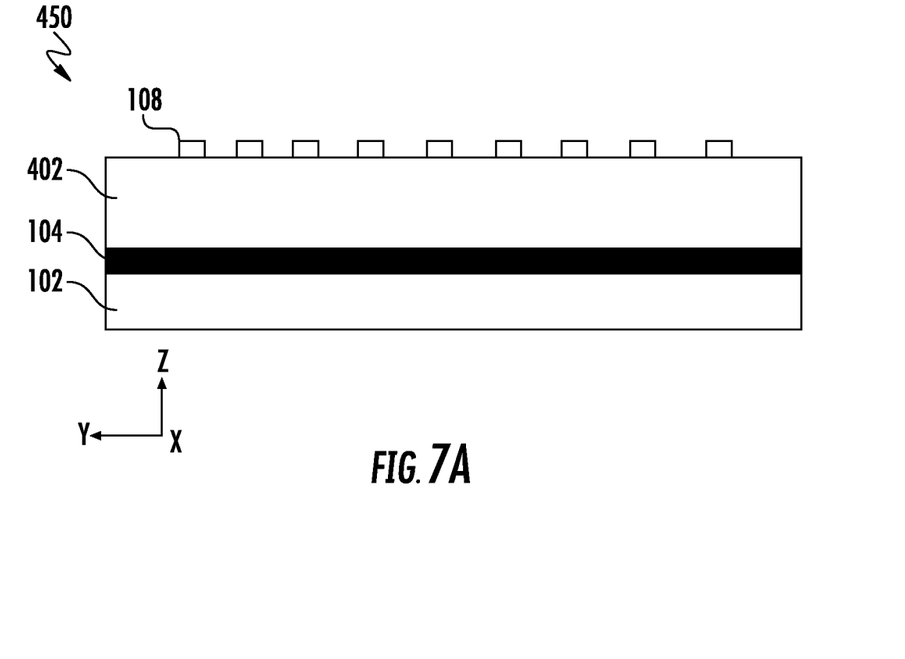
FIG. 7A-FIG. 7B depict various stages in fabrication of an optical grating component according to some embodiments of the disclosure.
Figure 7B:
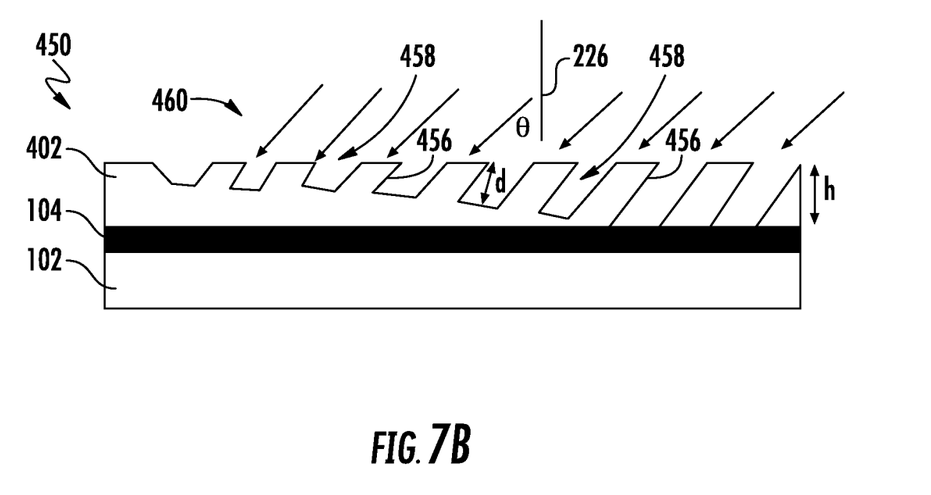

Turning now to FIGS. 7A-7B there is shown another sequence of operations for forming an optical grating component 450, according to alternative embodiments of the disclosure. In FIG. 7A, there is shown the substrate 102, etch stop layer 104, an optical grating layer 402, having uniform thickness, and a mask layer 108 in place, as generally described above. In FIG. 7B, there is shown an operation where a directional reactive ion etching process is performed to etch the optical grating layer 402. In this embodiment, the directional reactive ion etch is combined with a selective area processing procedure, and the combined procedure is represented by etching ions 460. The etching ions 460 both etch a pattern of angled structures 456, as well as generate non-uniform etching of the optical grating layer 402. In the approach shown in FIG. 7B, the results are shown after removal of the mask layer 108. By etching with the mask layer 108 in place, the resultant height h of the angled structures 456 remains uniform above the etch stop layer 104, while the depth of the angled trenches 458 between the angled structures 456 varies, creating angled structures whose depth d varies as a function of position along the Y-axis. This variation in depth d may have a similar effect on optical properties of a grating of varying of height of angled structures, as shown, for example, in FIG. 4D or FIG. 6C. As illustrated therein, because the angled structures are etched all the way to the etch stop layer 104, the variation in depth d tracks with the variation in height H.

As noted previously, the drawings may not be to scale, wherein the width of angled structures 456 may be on the order of hundreds of nanometers, while the variation in height depicted in the Z-axis direction as a function the Y-axis position may take place over millimeter or centimeter span. Thus, the variation in height may entail height changes for an assembly of thousands or tens of thousands of angles structures 456.

In additional embodiments, the height profile of gratings may vary along a direction not orthogonal to the direction of grating structures. For example, referring to FIG. 4D, while the angled structures 158 may extend in lines along the X-axis, a height variation may be introduced that extends along a direction within the X-Y plane that forms a non-zero angle with respect to the X-axis and the Y-axis. This non-orthogonal variation in height may be introduced by performing two SAP etches: one orthogonal to the grating lines (angled structures), and then a second 'correction' SAP etch to change the depth. Alternatively, an SAP etch process may be performed with the substrate oriented along a particular vector.

In the latter case, where a series of lines of an optical grating are oriented along a line direction, a selective area processing operation may be performed by scanning the substrate along a scan direction, wherein a variable depth in the optical grating is generated along the scan direction. The scan direction may be arranged to form an angle within the plane of the substrate with respect to the line direction of less than ninety degrees and more than zero degrees.

While the above embodiments are mostly detailed within the context of forming optical gratings directly in an eyepiece, in other embodiments, the same grating structure as shown in FIG. 1A, 1B, or 4D, for example, may be used to form a master. Said differently, the optical grating component 100, or similar grating component, with or absent the etch stop layer 104, may serve as a master to imprint a grating pattern into an optical grating layer on an eyepiece, or to be applied to an eyepiece. Notably, in embodiments where the optical grating component is to serve as a master, the substrate, the etch stop layer, if included, as well as the optical grating layer, need not be optically transparent.

Moreover, while the aforementioned embodiments focus on ribbon ion beams to perform selective area processing, as well as angled etching, in various embodiments a beam, such as a radical beam may be used to perform etching.

Figure 8:
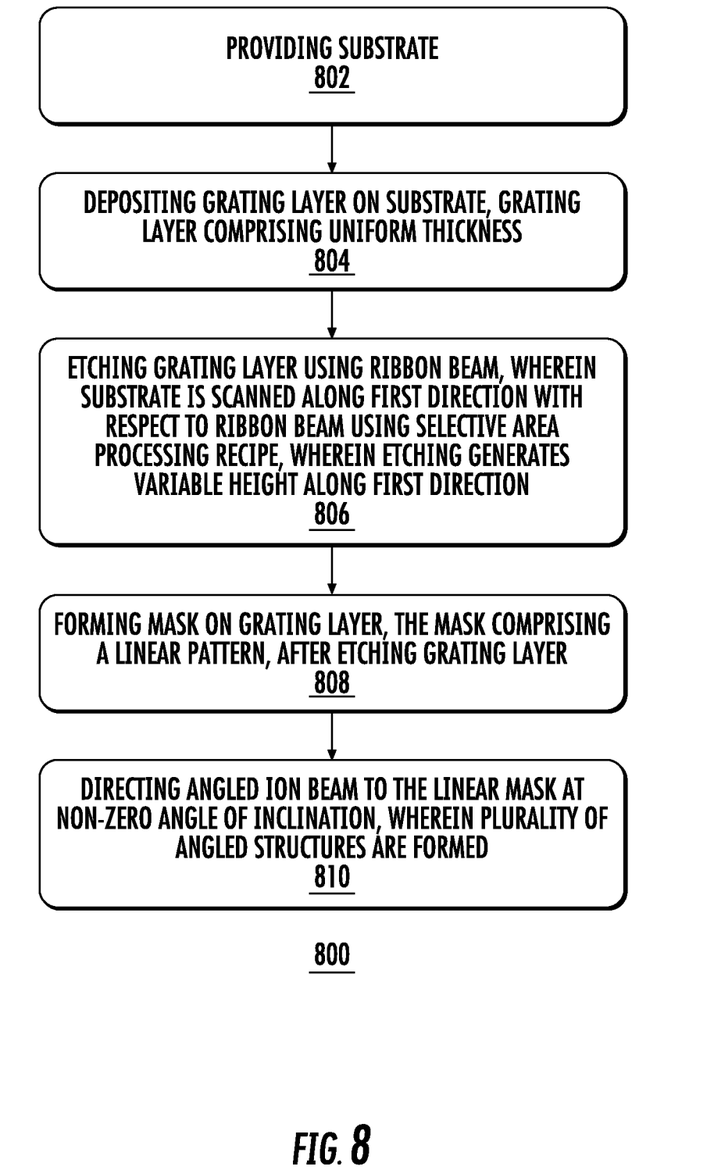
FIG. 8 depicts a process flow in accordance with embodiments of the disclosure.

Turning now to FIG. 8, a method 800 according to embodiments of the present disclosure will be described in greater detail. Specifically, at block 802, a substrate is supplied. In some embodiments, the substrate may include an etch stop layer, while in other embodiments, an etch stop layer may be omitted. At block 804, a grating layer having a uniform thickness is deposited on the substrate. In some embodiments, the grating layer may comprise an optically transparent material, including, but not limited to, silicon oxide, silicon nitride, glass, or other material.

At block 806, etching of the grating layer is performed using a ribbon ion beam. The substrate is scanned along a first direction with respect to the ribbon ion beam using a selective area processing recipe. As such the etching of the grating layer generates a variable height along the first direction, where the first direction is along the scan direction. In particular embodiments, the selective area processing recipe may entail changing at least one process parameter during scanning of the substrate, as detailed hereinabove. In particular embodiments, the variable height may be a smooth variation in height along the scan direction, where the variation in height is tailored to optimize performance of an optical grating to be formed.

At block 808, a mask is formed on the grating layer, where the mask comprises a linear pattern. The linear pattern may have linear mask elements that extend along a second direction, perpendicular to the first direction, or scan direction.

At block 810, an angled ion beam is directed to the linear mask and to the grating layer underneath. The angled ion beam may form a non-zero angle of incidence with respect to a perpendicular to the plane of the substrate. As such, a plurality of angled structures are formed, defining an optical grating within the grating layer, where the optical grating has a variable height along the first direction. In particular, the angled structures may extend along the second direction. In particular embodiments, the angled structures may be defined by a pitch on the order of one micrometer or less, while having a width on the order of one centimeter or more. In some embodiments, the ion beam may be provided as a ribbon beam having a long axis that extends parallel to the second direction, and may be scanned along the first direction.

Figure 9:
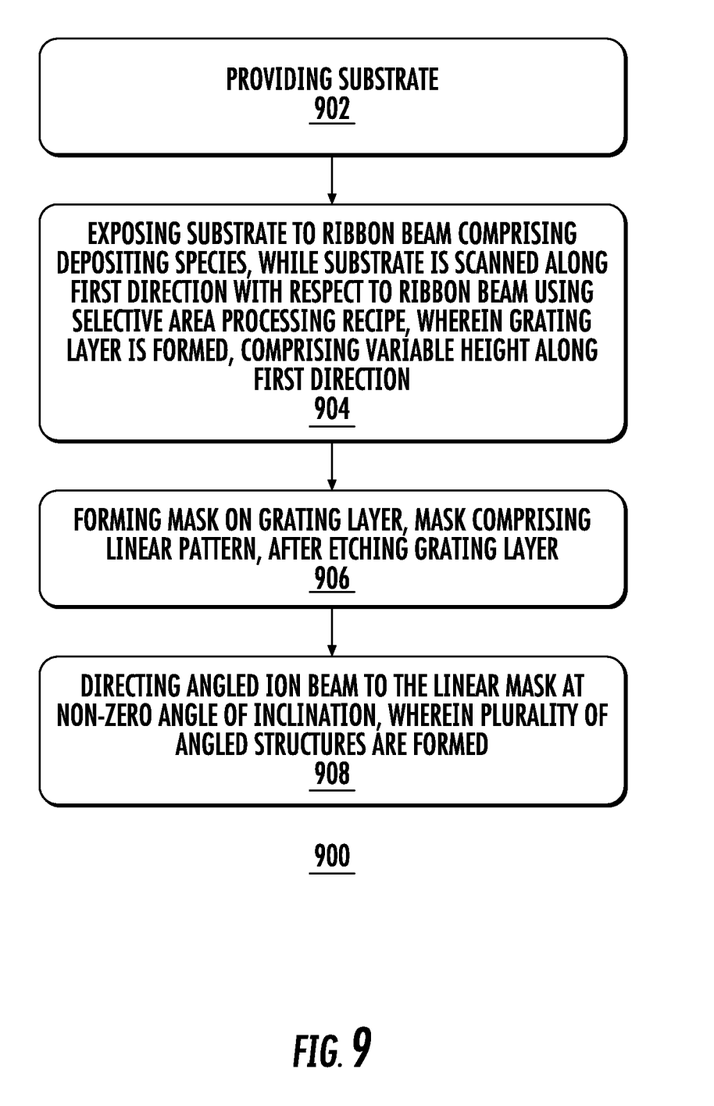
FIG. 9 depicts another process flow in accordance with embodiments of the disclosure.

Turning now to FIG. 9, a method 900 according to embodiments of the present disclosure will be described in greater detail. Specifically, at block 902, a substrate is supplied, as generally described with respect to block 802.

At block 904, the substrate is exposed to a ribbon ion beam, comprising a depositing species, while the substrate is scanned along a first direction with respect to the ribbon ion beam using a selective area processing recipe, as discussed hereinabove. As such, a grating layer is formed, comprising variable height along the first direction (scan direction).

At block 906, a mask layer is formed on the grating layer, such as detailed in block 808. At block 908, an angled ion beam is directed to the mask and grating layer, as described above with respect to block 810.

In sum, various embodiments described herein provide approaches for forming optical grating components including eyepieces for AR & VR, or masters for forming optical gratings for AR&VR eyepieces. Manufacturing may be accomplished by direct application of the angled ions on the substrate, or on a mask from which the pattern is transferred to the substrate of interest. A first technical advantage of the present embodiments includes the ability to readily form optical gratings having smoothly varying grating height, providing superior optical performance over known AR&VR equipment. Another advantage is the ability to fabricate grating layers having variable height, as well as gratings having angled structures within the same apparatus, reducing the complexity of manufacturing optical grating components.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming an optical grating component, comprising:
   providing a substrate, the substrate being optically transparent;
   forming a grating layer on the substrate, wherein the grating layer defines a variable height along a first direction; and
   forming an optical grating in the grating layer, wherein the optical grating comprises a plurality of angled structures, disposed at a non-zero angle of inclination with respect to a perpendicular to a plane of the substrate, wherein the plurality of angled structures are arranged to define a variable height along the first direction, the first direction being parallel to the plane of the substrate, wherein the forming the optical grating comprises:
   depositing a grating layer on the substrate, the grating layer comprising a constant thickness; and
   etching the grating layer using a ribbon ion beam, wherein the substrate is scanned along a scan direction with respect to the ribbon ion beam using a selective area processing recipe, wherein the etching generates the variable height as a smooth variation in height along the scan direction;
   forming a mask on the grating layer after the etching the grating layer, the mask comprising a linear pattern; and
   directing an angled ion beam to the mask at the non-zero angle of inclination, wherein the plurality of angled structures are formed, wherein the smooth variation in height results in a change in height between adjacent angled structures of the plurality of angled structures of the optical grating to be less than 10%.

2. The method of claim 1, wherein the plurality of angled structures extend along a second direction, perpendicular to the second direction, and wherein a height of an angled structure along the second direction is constant.

3. The method of claim 2, wherein the optical grating is a first optical grating, the method further comprising forming a second optical grating in the grating layer, the second optical grating comprising a second plurality of angled structures, disposed at a second non-zero angle of inclination with respect to the perpendicular to the plane of the substrate, wherein the second plurality of angled structures are arranged to define a second variable height along the second direction.

4. The method of claim 3, wherein the plurality of angled structures are a first plurality of angled structures, wherein the first plurality of angled structures are elongated along the second direction, and wherein the second plurality of angled structures are elongated along the first direction.

5. The method of claim 1, wherein the variable height comprises a smooth variation in height along the first direction, wherein a change in grating height H or depth d between adjacent angled structures of the optical grating to be less than 10%.

6. A method of forming an optical grating component, comprising:
   providing a substrate, the substrate being optically transparent;
   forming a grating layer on the substrate, wherein the grating layer defines a variable height along a first direction; and
   forming an optical grating in the grating layer, wherein the optical grating comprises a plurality of angled structures, disposed at a non-zero angle of inclination with respect to a perpendicular to a plane of the substrate, wherein the plurality of angled structures are arranged to define a variable height along the first direction, the first direction being parallel to the plane of the substrate, wherein the forming the optical grating comprises:
   depositing the grating layer on the substrate, the grating layer comprising a varying thickness, wherein the depositing comprises exposing the substrate to a ribbon ion beam comprising a depositing species, wherein the substrate is scanned along a scan direction with respect to the ribbon ion beam using a selective area processing recipe, wherein the depositing generates the variable height as a smooth variation in height;
   forming a mask on the grating layer, the mask comprising a linear pattern; and
   directing an angled ion beam to the mask at the non-zero angle of inclination, wherein the plurality of angled structures are formed, wherein the smooth variation in height results in a change in height between adjacent angled structures of the plurality of angled structures of the optical grating to be less than 10%.

7. A method of forming an optical grating component, comprising:
providing a substrate, the substrate being optically transparent;
forming a grating layer on the substrate, wherein the grating layer defines a variable height along a first direction; and
forming an optical grating in the grating layer, wherein the optical grating comprises a plurality of angled structures, disposed at a non-zero angle of inclination with respect to a perpendicular to a plane of the substrate, wherein the plurality of angled structures are arranged to define a variable height along the first direction, the first direction being parallel to the plane of the substrate, wherein the forming the optical grating comprises:
forming a mask layer on the optical grating layer;
etching the optical grating layer to form a uniform grating, the uniform grating defining a constant height along the first direction; and
etching the uniform grating using a ribbon ion beam, wherein the substrate is scanned along a scan direction with respect to the ribbon ion beam using a selective area processing recipe, wherein the etching generates the variable height as a smooth variation in height along the scan direction, wherein the smooth variation in height results in a change in height between adjacent angled structures of the plurality of angled structures of the optical grating to be less than 10%.

8. A method of forming an optical grating component, comprising:
providing a substrate;
forming a grating layer on the substrate, the grating layer comprising a plurality of optical gratings, wherein a first optical grating of the plurality of optical gratings comprises a plurality of angled structures, disposed at a non-zero angle of inclination with respect to a perpendicular to a plane of the substrate, wherein the plurality of angled structures are arranged to define a variable height along a first direction, the first direction being parallel to the plane of the substrate; and
imprinting the plurality of optical gratings into an eyepiece grating layer, the eyepiece grating layer to be arranged on an eyepiece,
wherein the forming the optical grating comprises:
depositing a grating layer on the substrate, the grating layer comprising a constant thickness; and
etching the grating layer using a ribbon ion beam, wherein the substrate is scanned along a scan direction with respect to the ribbon ion beam using a selective area processing recipe, wherein the etching generates the variable height as a smooth variation in height along the scan direction;
forming a mask on the grating layer after the etching the grating layer, the mask comprising a linear pattern; and
directing an angled ion beam to the mask at the non-zero angle of inclination, wherein the plurality of angled structures are formed, wherein the smooth variation in height results in a change in height between adjacent angled structures of the plurality of angled structures of the optical grating to be less than 10%.

9. The method of claim 8, wherein a second optical grating of the plurality of optical gratings comprises a second plurality of angled structures, disposed at a second non-zero angle of inclination with respect to the perpendicular to the plane of the substrate, wherein the second plurality of angled structures are arranged to define a second variable height along the second direction, wherein first optical grating and the second optical grating are imprinted into the eyepiece grating layer.

10. A method of forming an optical grating component, comprising:
providing a substrate, the substrate having an etch stop layer, an optical grating layer, and a mask layer, disposed thereon; and
etching the grating layer using a ribbon ion beam, wherein the substrate is scanned along a scan direction with respect to the ribbon ion beam using a selective area processing recipe,
wherein the etching generates a plurality of angled structures, separated by a plurality of angled trenches, defined by a depth between adjacent angled structures,
and wherein the etching generates a variable depth of the angled trenches as a smooth variation in depth along the scan direction, wherein the smooth variation in depth comprises a change in depth between adjacent angled trenches of the plurality of angled trenches of the optical grating component to be less than 10%.

11. A method of forming an optical grating component, comprising:
providing a substrate, the substrate being optically transparent;
forming a grating layer on the substrate;
patterning the grating layer to from an optical grating, comprising a plurality of lines, extending along a line direction within a plane of the substrate; and
performing a selective area processing operation by scanning the substrate along a scan direction, wherein a variable depth in the optical grating is generated along the scan direction, and wherein the scan direction forms an angle within the plane of the substrate with respect to the line direction of less than ninety degrees and more than zero degrees, wherein the patterning the grating layer takes place after the selective area processing operation.

* * * * *